United States Patent
Shen et al.

(10) Patent No.: US 12,249,623 B2
(45) Date of Patent: Mar. 11, 2025

(54) SEMICONDUCTOR DEVICES HAVING PARASITIC CHANNEL STRUCTURES

(71) Applicant: Taiwan Semiconductor Manufacturing Co., Ltd., Hsinchu (TW)

(72) Inventors: Yu-Cheng Shen, Hsinchu (TW); Guan-Jie Shen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 546 days.

(21) Appl. No.: 17/447,099

(22) Filed: Sep. 8, 2021

(65) Prior Publication Data

US 2022/0336585 A1    Oct. 20, 2022

Related U.S. Application Data

(60) Provisional application No. 63/175,706, filed on Apr. 16, 2021.

(51) Int. Cl.
| | |
|---|---|
| *H01L 29/423* | (2006.01) |
| *H01L 21/8234* | (2006.01) |
| *H01L 29/06* | (2006.01) |
| *H01L 29/66* | (2006.01) |
| *H01L 29/78* | (2006.01) |
| *H01L 29/786* | (2006.01) |

(52) U.S. Cl.
CPC .. *H01L 29/0673* (2013.01); *H01L 21/823468* (2013.01); *H01L 29/42392* (2013.01); *H01L 29/6656* (2013.01); *H01L 29/66742* (2013.01); *H01L 29/7848* (2013.01); *H01L 29/78618* (2013.01); *H01L 29/78696* (2013.01)

(58) Field of Classification Search
CPC ......... H01L 29/0673; H01L 21/823468; H01L 29/42392; H01L 29/6656; H01L 29/66742; H01L 29/7848; H01L 29/78618; H01L 29/78696; H01L 29/665; H01L 29/66439; H01L 29/66545; H01L 29/775; H01L 29/42372
See application file for complete search history.

(56) References Cited

U.S. PATENT DOCUMENTS

| | | | |
|---|---|---|---|
| 11,114,345 B2 | 9/2021 | Liaw | |
| 2014/0203327 A1* | 7/2014 | Pillarisetty | ........ H01L 29/78606 438/285 |

(Continued)

FOREIGN PATENT DOCUMENTS

| | | |
|---|---|---|
| TW | 2021-09837 A | 3/2021 |

*Primary Examiner* — Eric K Ashbahian
*Assistant Examiner* — David W Ward
(74) *Attorney, Agent, or Firm* — Sterne, Kessler, Goldstein & Fox P.L.L.C.

(57) ABSTRACT

The present disclosure describes a semiconductor device and methods for forming the same. The semiconductor device includes nanostructures on a substrate and a source/drain region in contact with the nanostructures. The semiconductor device also includes a gate structure that includes first and second portions. The first portion is formed between each nanostructure of nanostructures. The second portion is formed under the bottom-most nanostructure of the plurality of nanostructures and extends under a top surface of the substrate.

20 Claims, 16 Drawing Sheets

(56) References Cited

U.S. PATENT DOCUMENTS

| | | | |
|---|---|---|---|
| 2018/0047835 A1* | 2/2018 | Chao | H01L 29/7853 |
| 2018/0083113 A1* | 3/2018 | Balakrishnan | H01L 29/78696 |
| 2020/0357911 A1* | 11/2020 | Frougier | H01L 29/42392 |
| 2020/0403097 A1* | 12/2020 | Wang | H01L 29/7842 |
| 2021/0202478 A1* | 7/2021 | Guha | H01L 29/78696 |
| 2021/0202479 A1* | 7/2021 | Naskar | H01L 21/0214 |

* cited by examiner

SEMICONDUCTOR DEVICES HAVING PARASITIC CHANNEL STRUCTURES

CROSS-REFERENCE TO RELATED APPLICATIONS

The present application claims the benefit of U.S. Provisional Patent Appl. No. 63/175,706, titled "Semiconductor Devices Having Parasitic Channel Structures" and filed on Apr. 16, 2021, which is incorporated herein by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices and three-dimensional transistors, such as gate-all-around field effect transistors (GAAFETs) and fin field effect transistors (finFETs), are introduced.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
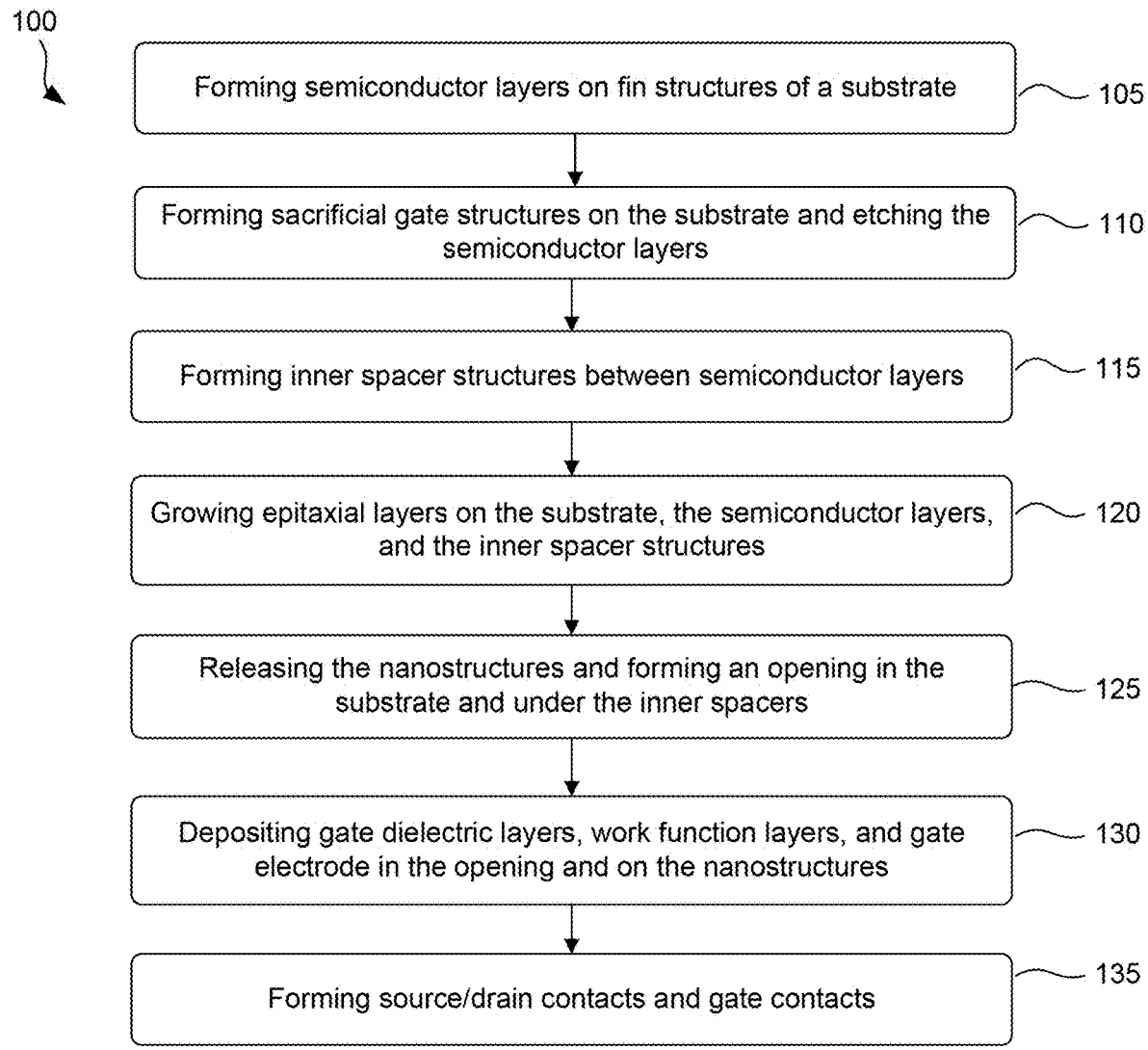
FIG. 1 is a flow diagram of a method for fabricating multi-layer epitaxial source/drain structures in semiconductor devices, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. An example of a FET is a metal oxide semiconductor field effect transistor (MOSFET). MOSFETs can be, for example, (i) planar structures built in and on the planar surface of a substrate, such as a semiconductor wafer, or (ii) built with vertical structures.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The terms "about" and "substantially" as used herein indicate the value of a given quantity that can vary based on a particular technology node associated with the subject semiconductor device. In some embodiments, based on the particular technology node, the terms "about" and "substantially" can indicate a value of a given quantity that varies within, for example, 5% of the value (e.g., ±1%, ±2%, ±3%, ±4%, ±5% of the value), 10% of the value, 20% of the value, etc.

The present disclosure provides example field effective transistor (FET) devices (e.g., gate-all-around (GAA) FETs, fin-type FET (finFETs), horizontal or vertical GAA finFETs, or planar FETs) in a semiconductor device and/or in an integrated circuit (IC) and example methods for fabricating the same.

GAAFETs and finFETs increase device density and improve device performance. GAAFETs and finFETs include a pair of source/drain regions formed on opposing sides of a channel region. As the semiconductor industry continues to scale down the dimensions of semiconductor devices, circuit complexity has increased at all device levels. For example, beyond the 5 nm technology node or the 3 nm technology node, increased source/drain tunneling can increase leakage current and cause device failure. Short channel effects can also be one of the reasons for device failure. Semiconductor devices implementing nanostructures, such as nanowires and nanosheets, are potential candidates to overcome the short channel effects. Among them, GAAFETs can reduce short channel effects and enhance carrier mobility, which in turn improve device performance. It has become increasingly challenging to further reduce leakage paths formed under a gate stack and between the pair of source/drain regions. For example, during formation of gate stacks, gate dielectric material and a gate electrode are also formed on top surfaces of the substrate or fin, resulting in a parasitic channel that can act as a leakage path connecting the pair of source/drain structures. Leak current flowing through the parasitic channel can impact off current and reduce device performance.

Various embodiments in the present disclosure describe methods for forming a gate stack extending into a region of the substrate that has lower carrier mobility, which in turn reduces current leakage between a pair of source/drain regions. The extended gate stack can be formed by etching an opening that extends from an upper region of the substrate to a lower region of the substrate that has a lower carrier concentration. The opening can also extend under inner spacers located on side surfaces of the gate stack. The gate stack, including gate dielectric layers and gate electrodes, can be formed in the opening. Extended gate stacks described herein provide various benefits, such as improved device performance and reliability. Benefits can also include, but are not limited to, reduced short channel effects, reduced subthreshold leakage, and improved device on/off current characteristics. The embodiments described herein use GAAFETs as examples and can be applied to other semiconductor structures, such as finFETs and planar FETs. In addition, the embodiments described herein can be used in various technology nodes, such as 14 nm, 7 nm, 5 nm, 3 nm, 2 nm, and lower technology nodes.

FIG. 1 is a flow diagram of a method 100 for fabricating a semiconductor device incorporating extended gate structures, according to some embodiments. For illustrative purposes, the operations illustrated in FIG. 1 will be described with reference to the example fabrication process of fabricating a semiconductor device 200 as illustrated in FIGS. 2A-2D, 3A, 3B, and 4-8. Operations can be performed in a different order or not performed depending on specific applications. It should be noted that method 100 may not produce a complete semiconductor device. Accordingly, it is understood that additional processes can be provided before, during, and after method 100, and that some other processes may only be briefly described herein.

Figures 2A, 2B:
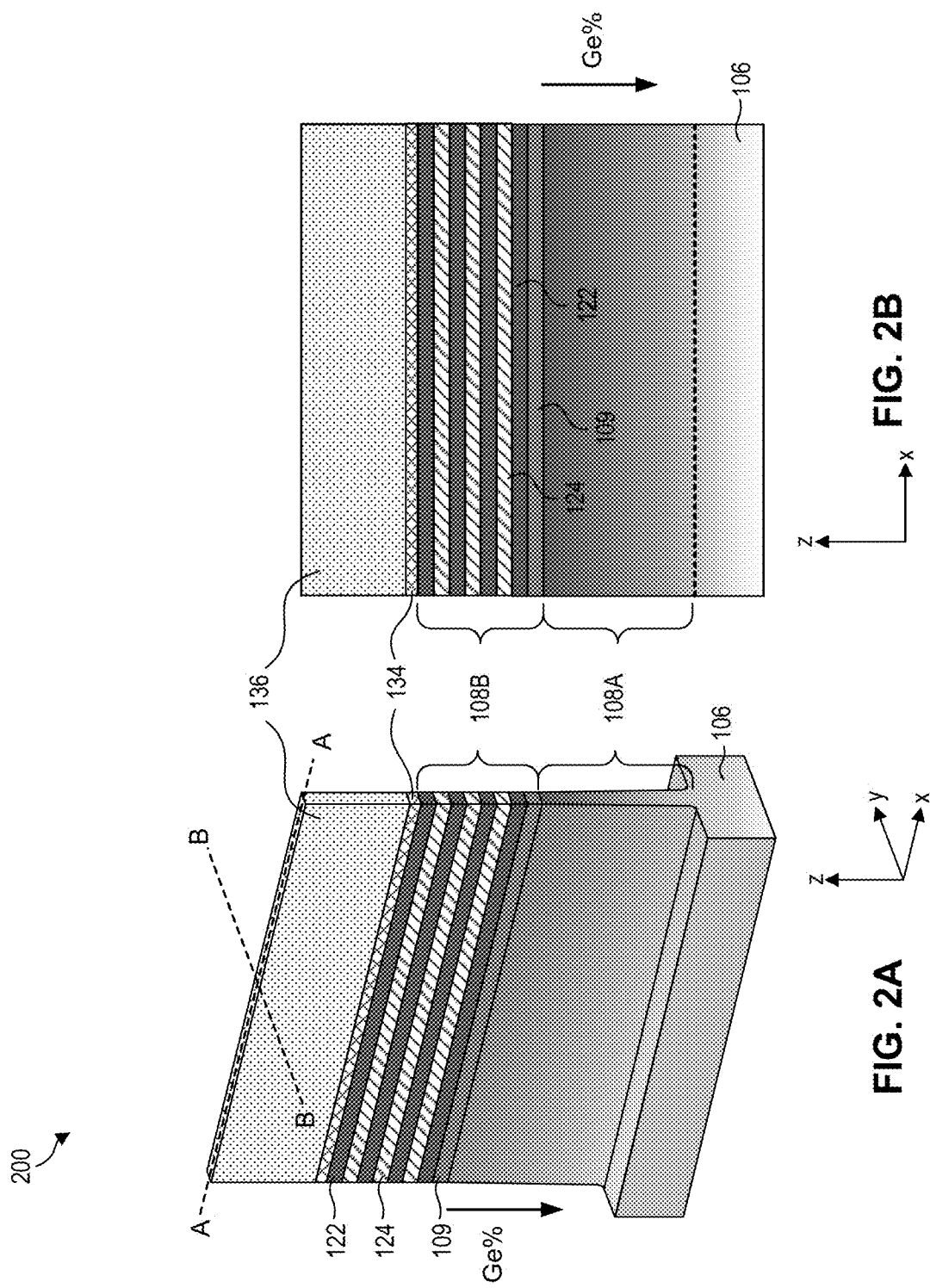
FIGS. 2A-2D, 3A, 3B, and 4-8 illustrate various cross-sectional views of semiconductor devices at various stages of their fabrication process, in accordance with some embodiments.
Figure 2D:
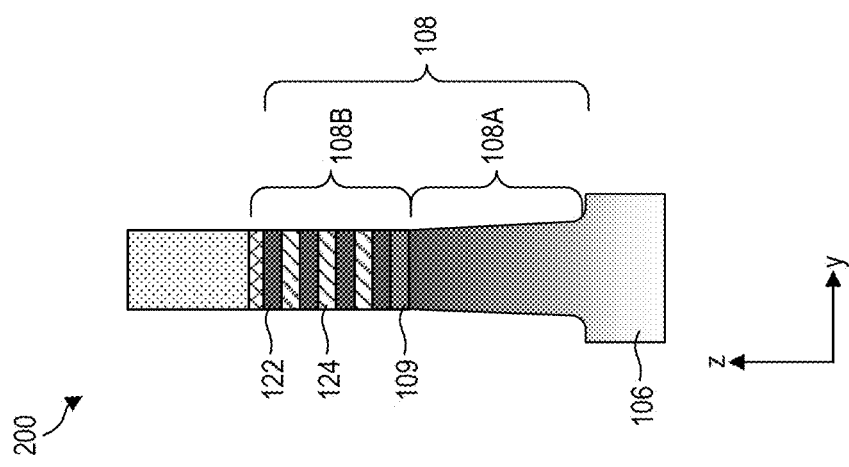
Figure 2C:
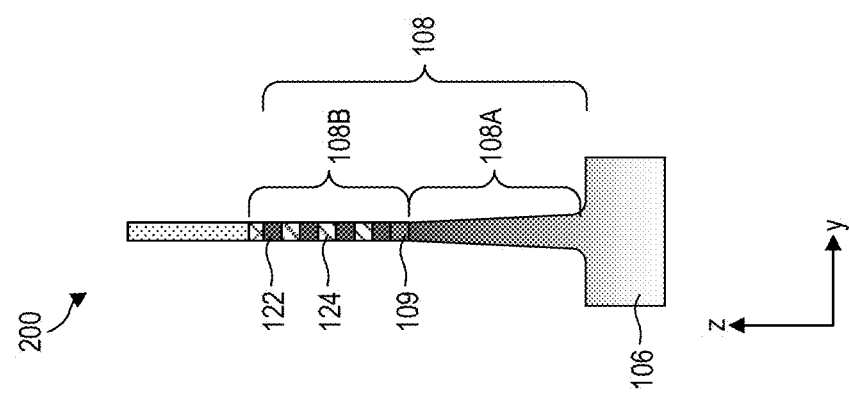

Referring to FIG. 1, in operation 105, semiconductor layers are formed on fin structures of a substrate, according to some embodiments. For example, fin structure 108 with fin base portion 108A and fin top portion 108B can be formed on substrate 106 as described with reference to semiconductor device 200 illustrated in FIGS. 2A-2C. FIG. 2B is a cross-sectional view of the structure in FIG. 2A as viewed from the A-A line. FIG. 2C is a cross-sectional view of the structure in FIG. 2A as viewed from the B-B line. The formation of fin structure 108 can include the formation of fin base portion 108A and fin top portion 108B on substrate 106. FIGS. 2A-2C illustrate semiconductor layers formed in a wire configuration (e.g., cross-sectional area having a substantially square shape). Alternatively, semiconductor layers of semiconductor device 200 can also be formed in a sheet configuration (e.g., cross-sectional area having a substantially rectangular shape), as illustrated in FIG. 2D.

Substrate 106 can be a semiconductor material, such as silicon. In some embodiments, substrate 106 includes a crystalline silicon substrate (e.g., wafer). In some embodiments, substrate 106 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

Fin structure 108 extends along an x-axis. Fin structure 108 can be a part of a substrate and include a fin base portion 108A and a fin top portion 108B disposed on fin base portion 108A.

Fin base portion 108A can include material similar to substrate 106. Fin base portion 108A can be formed from a photolithographic patterning and an etching of substrate 106. In some embodiments, fin base portion 108A can be formed of silicon germanium with a germanium concentration gradually decreasing from the top surface of fin structure 108. In some embodiments, the germanium concentration within fin structure 108 is highest at the top surface of fin structure 108.

Fin top portion 108B can include a stack of semiconductor layers. Each semiconductor layer can be subsequently processed to form a channel region underlying subsequently formed gate structures of the finFETs. Fin top portion 108B can include a first group of semiconductor layers 122 and a second group of semiconductor layers 124 stacked in an alternating configuration. Each of semiconductor layers 122 and 124 can be epitaxially grown on its underlying layer and can include semiconductor materials different from each other. In some embodiments, semiconductor layers 122 and 124 can include semiconductor materials similar to or different from substrate 106. In some embodiments, semiconductor layers 122 and 124 can include semiconductor materials with oxidation rates and/or etch selectivities different from each other. In some embodiments, each of semiconductor layers 122 can be formed of silicon and each of semiconductor layers 124 can be formed of silicon germanium. In some embodiments, semiconductor layers 122 can be formed of silicon germanium and semiconductor layers 124 can be formed of silicon. Semiconductor layers 122 and/or semiconductor layers 124 can be undoped or can be in-situ doped during their epitaxial growth process using (i) p-type dopants, such as boron, indium, and gallium; and/or (ii) n-type dopants, such as phosphorus and arsenic. For p-type in-situ doping, p-type doping precursors, such as diborane, boron trifluoride, and any other p-type doping precursor, can be used. For n-type in-situ doping, n-type doping precursors, such as phosphine and arsine, can be used. Though four layers for each of semiconductor layers 122 and semiconductor layers 124 are shown in FIGS. 2A-2C, semiconductor device 200 can have any suitable number of semiconductor layers 122 and semiconductor layers 124.

Sacrificial layer 109 can be formed between fin base portion 108A and the stack of semiconductor layers 122 and 124. Sacrificial layer 109 can be formed using the same material as fin base portion 108A but different atomic concentrations. For example, fin base portion 108A can be formed using silicon germanium with a gradually decreasing germanium concentration, whereas sacrificial layer 109 can be formed with a uniform germanium concentration that is substantially the same as the highest level of germanium concentration of fin base portion 108A. The difference in germanium concentration can provide different etching rates of sacrificial layer 109 over fin base portion 108A.

Forming fin base portion 108A and fin top portion 108B can also include etching the aforementioned stack of materials through patterned hard mask layers 134 and 136 formed on the stack of materials. In some embodiments, hard mask layer 134 can be a thin film including silicon oxide formed using, for example, a thermal oxidation process. In some embodiments, hard mask layer 136 can be formed of silicon nitride using, for example, low-pressure chemical vapor deposition (LPCVD) or plasma-enhanced chemical vapor deposition (PECVD). The etching of the stack of materials can include a dry etch, a wet etch process, or a combination thereof. Hard mask layers 134 and 136 can be removed after fin structures 108 are formed.

Fin top portions 108B can be formed using stacks of semiconductor layers 122 and 124 in a wire configuration, as shown in FIG. 2C. For example, sacrificial layer 109 and semiconductor layers 122 and 124 in FIG. 2C have a substantially square-shaped cross-sectional area. In some embodiments, fin top portions 108B can be formed using stacks of semiconductor layers 122 and 124 in a sheet configuration, as shown in FIG. 2D. For example, sacrificial layer 109 and semiconductor layers 122 and 124 in FIG. 2C have a substantially rectangular-shaped cross-sectional area. FIGS. 3A, 3B, and 4-8 illustrate forming semiconductor devices with semiconductor layers in a wire configuration which subsequently form nanosheet structures. The method illustrated in the aforementioned figures also applies to semiconductor devices with semiconductor layers in the sheet configuration that subsequently form nanosheet structures.

Figure 3A:
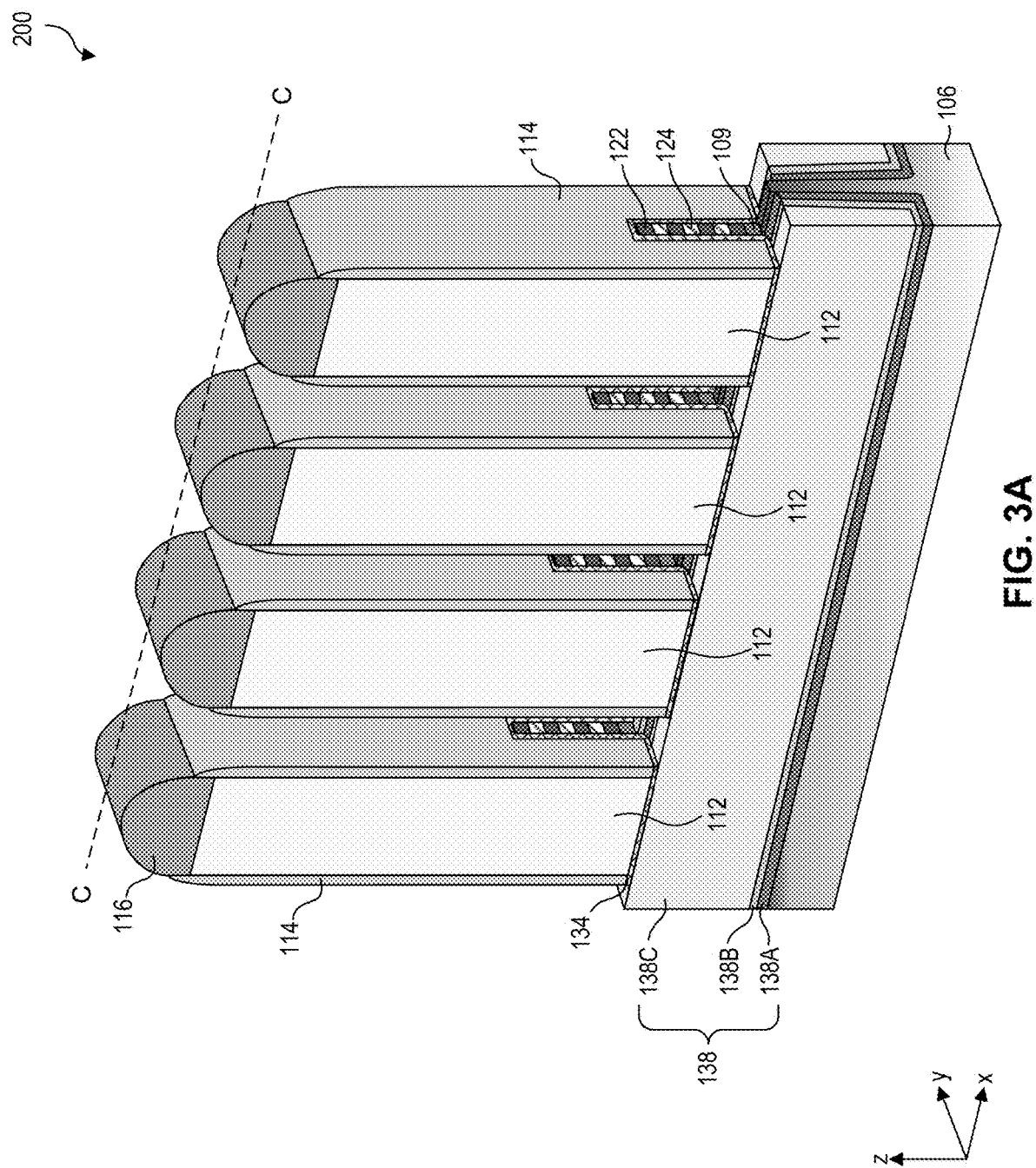
Figure 3B:
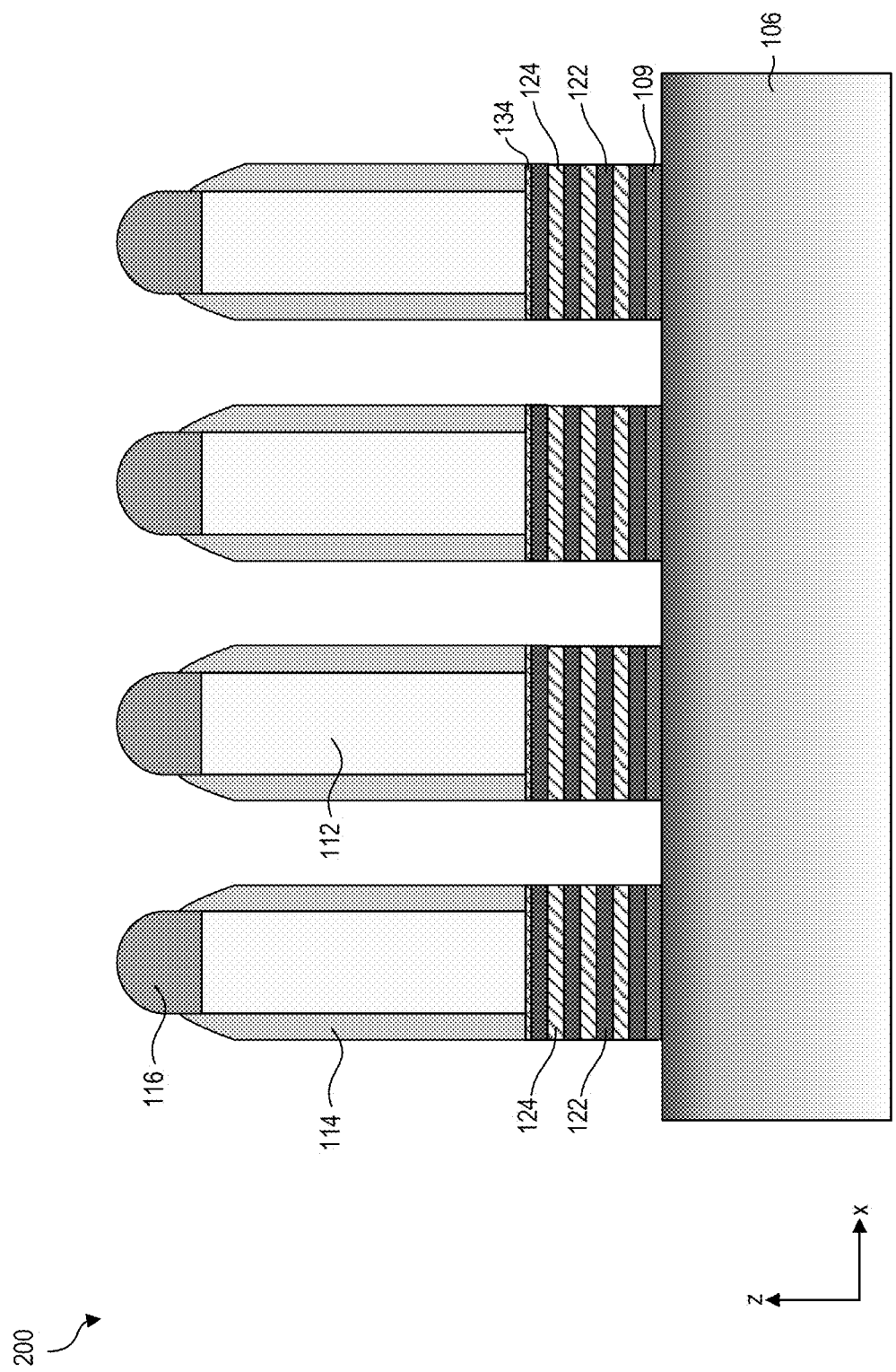

Referring to FIG. 1, in operation 110, sacrificial gate structures are formed on the substrate and the semiconductor layers are etched, according to some embodiments. Referring to FIGS. 3A and 3B, STI regions 138 with first and second protective liners 138A and 138B and insulating layer 138C can be formed on substrate 106. FIG. 3B is a cross-sectional view of semiconductor device 200 in FIG. 3A as viewed from the C-C line. In some embodiments, hard mask layer 136 remains on the top surfaces of hard mask layer 134 after the formation of STI regions 138. In some embodiments, hard mask layer 136 is removed prior to the formation of STI regions 138. Forming STI regions 138 can include (i) depositing a layer of nitride material (not shown) for first protective liners 138A on the structure of FIG. 2A, (ii) depositing a layer of oxide material (not shown) for second protective liners 138B on the layer of nitride material, (iii) depositing a layer of insulating material for insulating layers 138C on the layer of oxide material, (iv) annealing the layer of insulating material for insulating layer 138C, (v) chemical mechanical polishing (CMP) the layers of nitride and oxide materials and the annealed layer of insulating material, and (vi) etching back the polished structure to form the structure of FIG. 3A. The layers of nitride and oxide materials can be deposited using a suitable process for depositing oxide and nitride materials, such as atomic layer deposition (ALD) and chemical vapor deposition (CVD). These layers of oxide and nitride materials can prevent oxidation of the sidewalls of fin top portion 108B during the deposition and annealing of the insulating material for insulating layer 138C. In some embodiments, the layer of insulating material for insulating layer 138C can include silicon oxide, silicon nitride, silicon oxynitride, fluoride-doped silicate glass (FSG), or a low-k dielectric material. In some embodiments, the layer of insulating material can be deposited using a CVD process, a high-density-plasma (HDP) CVD process, using silane and oxygen as reacting precursors. In some embodiments, the layer of insulating material can be formed using a sub-atmospheric CVD (SACVD) process or high aspect-ratio process (HARP), where process gases can include tetraethoxysilane (TEOS) and/or ozone.

Polysilicon gate structures 112 are formed on STI regions 138, as shown in FIGS. 3A and 3B. Polysilicon gate structures 112 are sacrificial gate structures and can be replaced in a gate replacement process to form metal gate structures. In some embodiments, the formation of polysilicon gate structures 112 can include blanket depositing a layer of polysilicon material and etching the layer of polysilicon material through a patterned hard mask layer 116 formed on the layer of polysilicon material. In some embodiments, the layer of polysilicon material can be undoped and hard mask layer 116 can include an oxide layer and/or a nitride layer. The oxide layer can be formed using a thermal oxidation process and the nitride layer can be formed by LPCVD or PECVD. Hard mask layer 116 can protect polysilicon gate structures 112 from subsequent processing steps (e.g., during formation of spacers 114, and/or source/drain regions). The blanket deposition of the layer of polysilicon material can include CVD, physical vapor deposition (PVD), ALD, or any other suitable deposition process. In some embodiments, etching of the deposited layer of polysilicon material can include a dry etch, a wet etch, or a combination thereof. Spacers 114 can be formed on sidewalls of polysilicon gate structures 112. Forming spacers 114 can include blanket depositing a layer of an insulating material (e.g., an oxide, a nitride, and/or silicon carbon oxynitride material) followed by photolithography and an etching process (e.g., reactive ion etching or any other suitable dry etching process using a chlorine- or fluorine-based etchant).

Fin top portions can be etched after polysilicon gate structures 112 are formed. The etch process can remove portions of semiconductor layers 122 and semiconductor layers 124 that are exposed between adjacent polysilicon gate structures 112. The etch process can include a wet etch process using, for example, diluted HF. In some embodiments, one or more etching processes can be used. For example, the etching process can include an etching process for removing silicon material and another etching process for removing silicon germanium material. During the etching process, polysilicon gate structures 112 can be protected from being etched by spacers 114 and hard mask layer 116.

Figure 4:
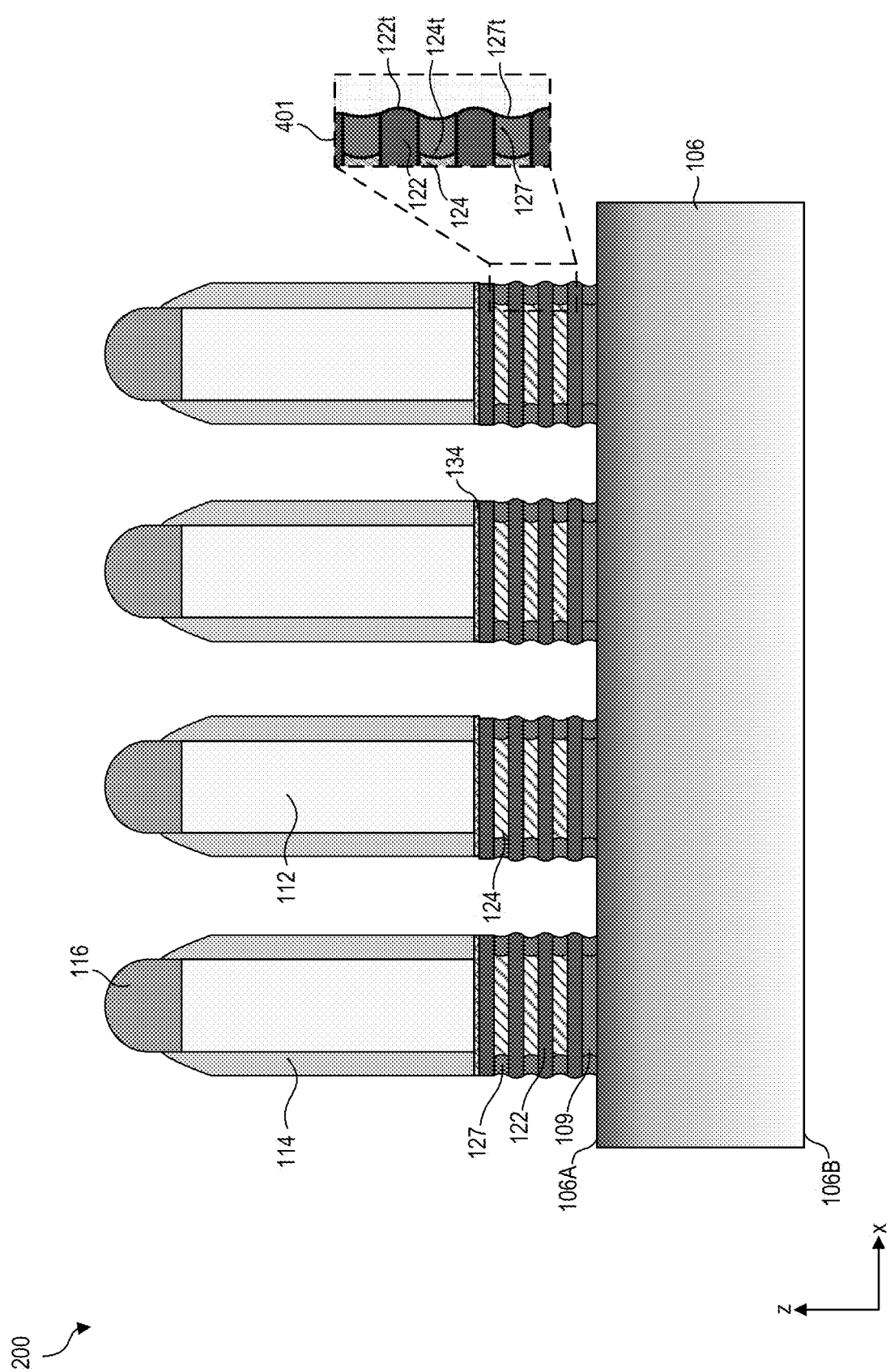

Referring to FIG. 1, in operation 115, inner spacer structures are formed between the semiconductor layers, according to some embodiments. Referring to FIG. 4, portions of semiconductor layers 124 can be etched back to form recessed regions and dielectric material can be deposited in the recessed regions to form inner spacers 127. For example, semiconductor device 200 shown in FIG. 4 can include n-type metal-oxide-semiconductor (NMOS) devices and portions of semiconductor layers 124 are etched back.

Semiconductor device 200 illustrated in FIG. 4 can include semiconductor layers 124, sacrificial layer 109, and substrate 106 formed using silicon germanium. In some embodiments, semiconductor layers 122 can be formed using silicon. Substrate 106 can have a gradually decreasing germanium concentration as measured from a top surface 106A to a bottom surface 106B of substrate 106.

Semiconductor device 200 can also include p-type metal-oxide-semiconductor (PMOS) devices. PMOS device configurations are not shown in FIG. 5 for simplicity. For the PMOS device configurations, semiconductor layers 124 can be processed to be used as the channel regions. Semiconductor layers 122 can be etched back using suitable etching processes and inner spacers 127 can be formed between adjacent semiconductor layers 124 using similar deposition and etching processes described below with respect to the etch back of semiconductor layers 124 and the formation of inner spacers 127.

Semiconductor layers 124 can be etched back by a dry etching process, a wet etching process, or a combination thereof. The etch back process of semiconductor layers 124 can be configured to form non-planar outer surfaces of semiconductor layers 122 and 124. For example, the etching process can include alternating cycles of etching and purging processes. The etching process in each cycle can include using a gas mixture having hydrogen fluoride, nitrogen trifluoride, a fluorine-based gas, and a chlorine-based gas.

As shown in enlarged view 401 of FIG. 4, semiconductor layers 122 can have curved convex outer surfaces 122t and semiconductor layers 124 can have curved concave outer surfaces 124t. In some embodiments, subsequently formed inner spacers 127 can also have outer surfaces 127t that substantially contour outer surface 124t of semiconductor layers 124.

Figure 5:
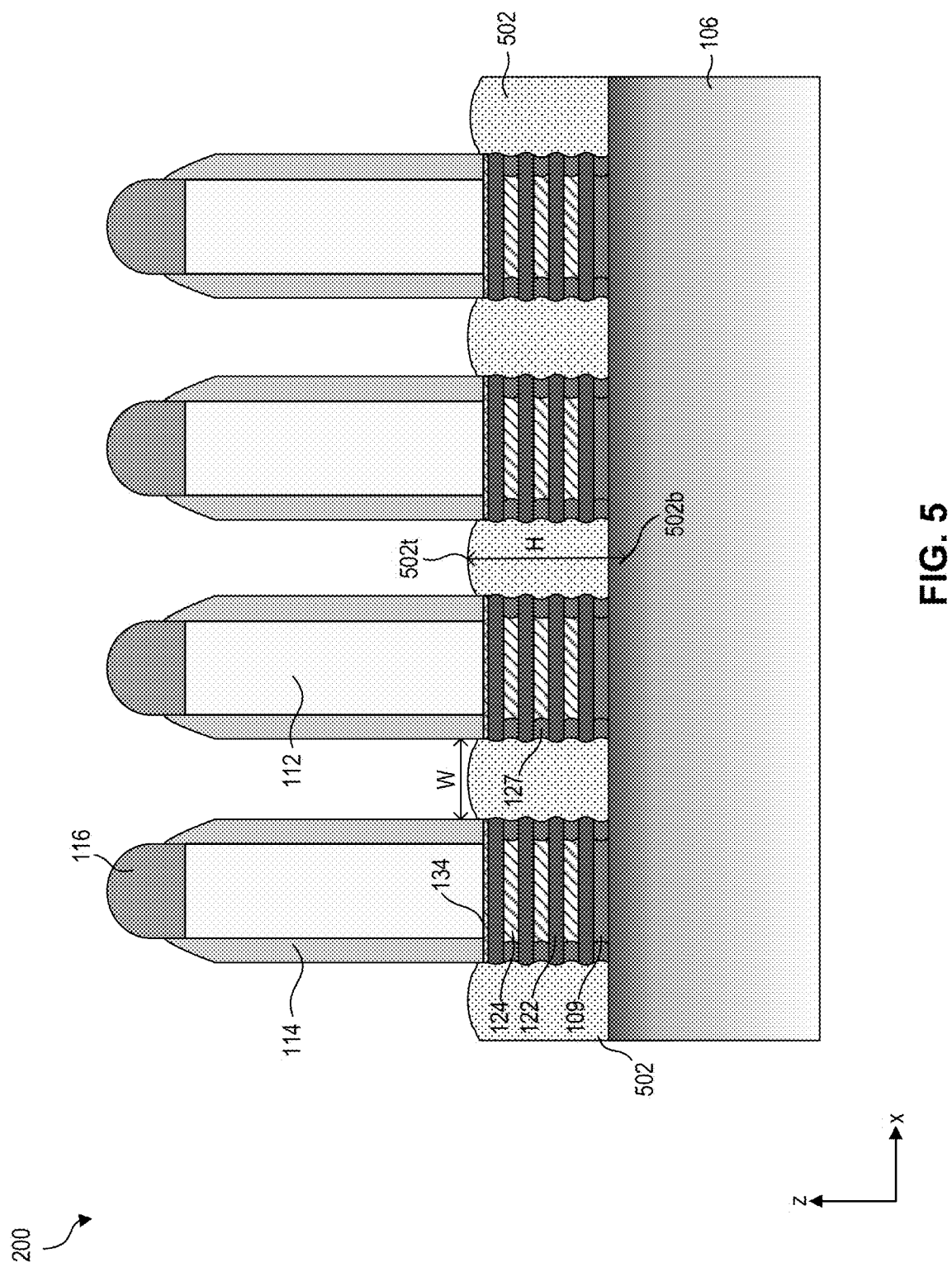

Referring to FIG. 1, in operation 120, epitaxial layers are grown on the substrate, the semiconductor layers, and the inner spacer structures, according to some embodiments. Referring to FIG. 5, source/drain structure 502 can be deposited on substrate 106 as well as outer surfaces of semiconductor layers 122 and inner spacers 127. In some embodiments, source/drain structure 502 can be formed by a selective growth process where a semiconductor material is grown on selective surfaces. For example, source/drain structure 502 can be formed by epitaxially growing a crystalline material using exposed portions of substrate 106 and semiconductor layers 122 as seed layers. In some embodiments, substrate 106 and semiconductor layers 122 are formed of crystalline silicon, and an epitaxial deposition method using self-assembly monolayer (SAM) or selective-area ALD can be used to selectively grow crystalline silicon on exposed surfaces of substrate 106 and semiconductor layers 122. Source/drain structure 502 can be formed using suitable deposition methods, such as (i) CVD, including but not limited to, LPCVD, atomic layer CVD (ALCVD), ultrahigh vacuum CVD (UHVCVD), reduced pressure CVD (RPCVD), and any other suitable CVD; (ii) molecular beam epitaxy (MBE) processes; (iii) any suitable epitaxial process; or (iv) a combination thereof. In some embodiments, source/drain structure 502 can be grown by an epitaxial deposition/partial etch process, which repeats the epitaxial deposition/partial etch process at least once. Such repeated deposition/partial etch process is also called a cyclic deposition-etch (CDE) process. In some embodiments, a plasma deposition process using species, such as germane, dichlorosilane, and hydrochloride, can be used to deposit source/drain structure 502 formed of silicon germanium.

Crystalline silicon material that are epitaxially deposited on adjacent semiconductor layers 122 and substrate 106 can expand and merge together, covering outer surfaces of inner spacer 127. A width W of source/drain structure 502 can be between about 10 nm and about 80 nm, between about 15 nm and about 75 nm, between about 20 nm and about 60 nm, or any suitable dimensions. In some embodiments, a height H of source/drain structure 502 measured from top surface 502t of source/drain structure 502 and bottom surface 502b can be between about 20 nm and about 140 nm, between about 30 nm and about 120 nm, between about 40 nm and about 100 nm, or any suitable dimensions. Source/drain structure 502 can be formed of silicon, silicon germanium, silicon phosphide, any suitable semiconductor material, and/or combinations of the same. In some embodiments, source/drain structure 502 can be doped with suitable dopants, such as boron and phosphorus.

Figure 6A:
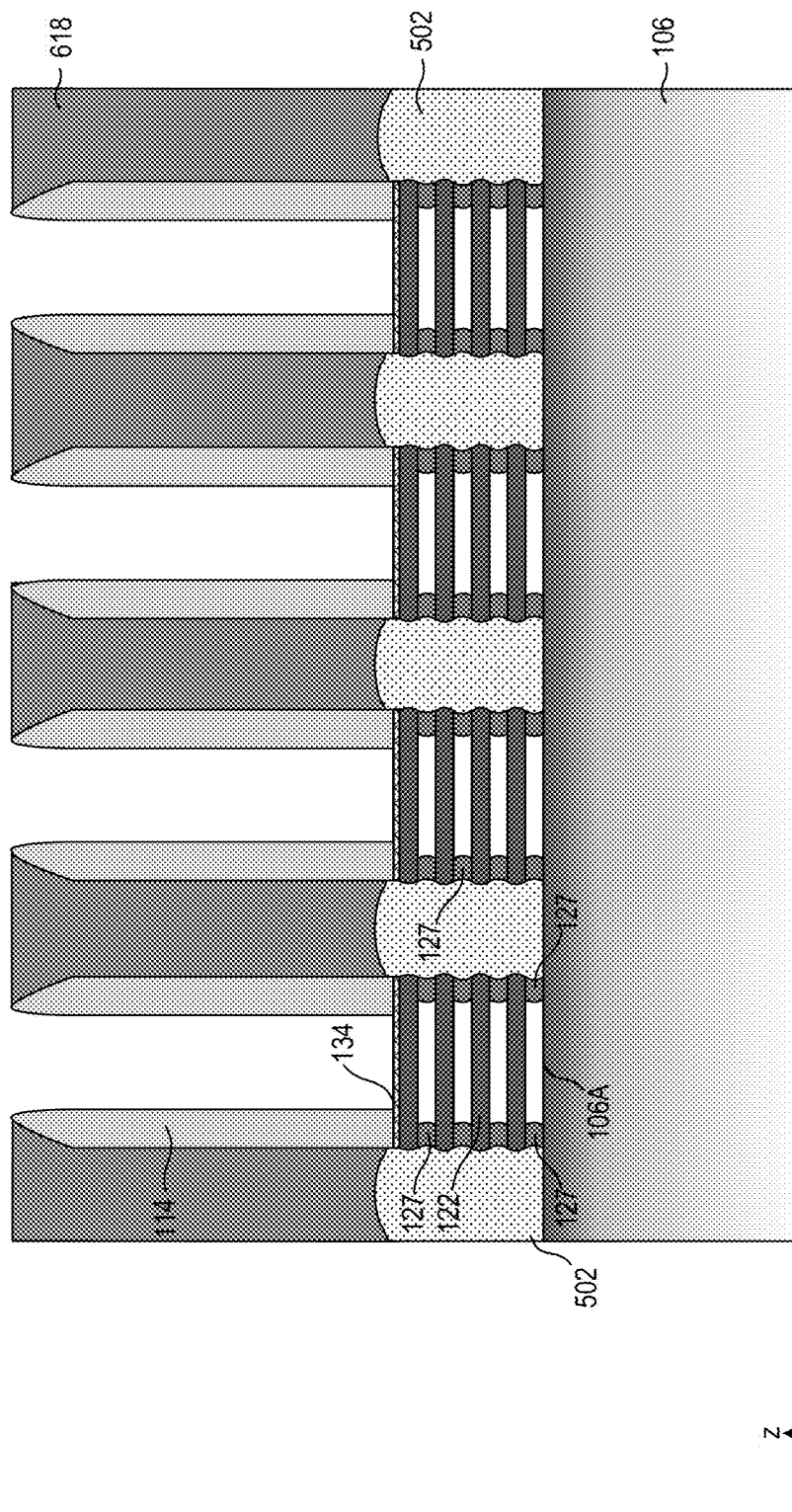
Figure 6B:
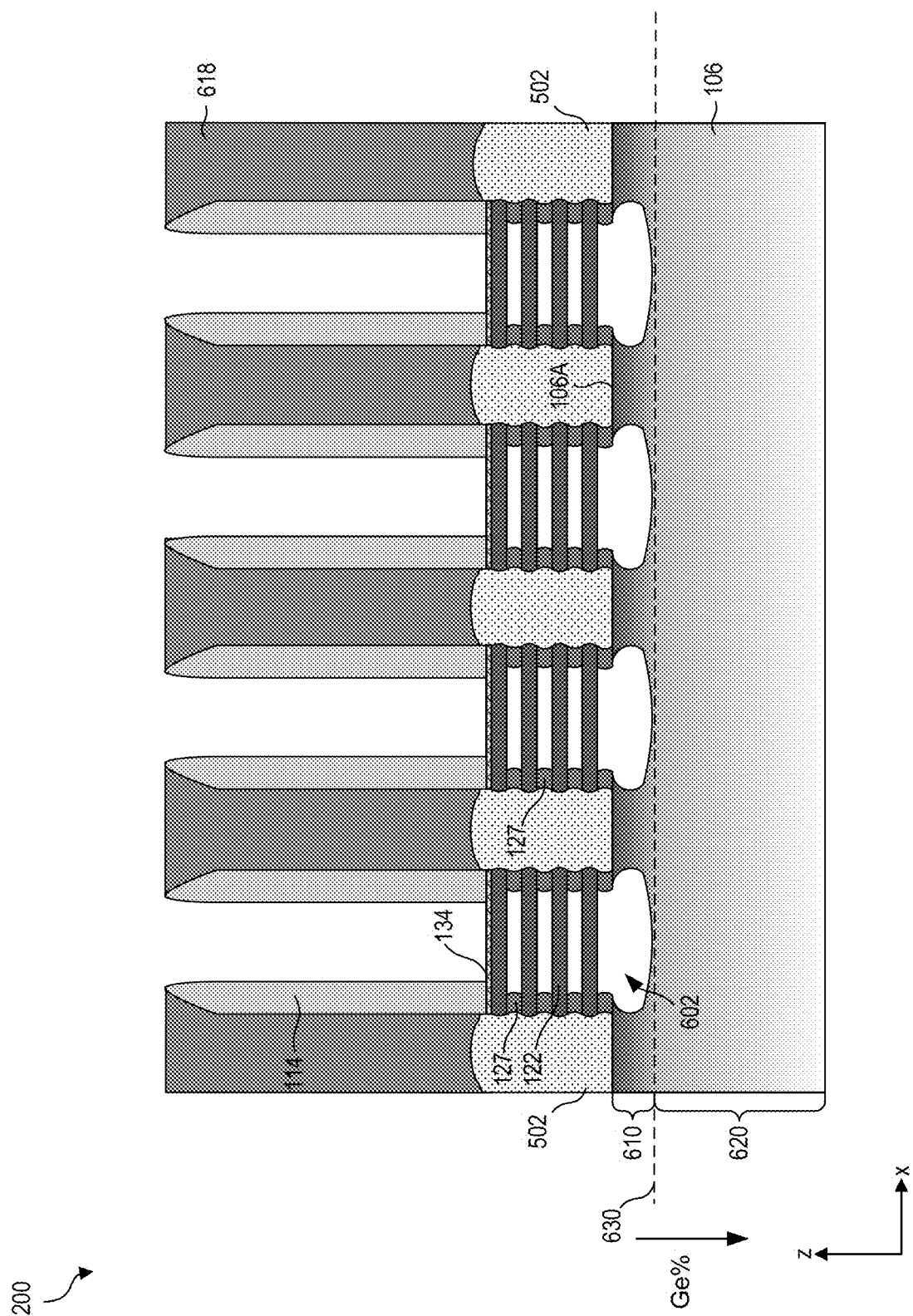

Referring to FIG. 1, in operation 125, nanostructures are released and an opening is formed in the substrate and under the inner spacers, according to some embodiments. Referring to FIGS. 6A and 6B, semiconductor layers 124 are removed, exposing portions of semiconductor layer 122 formed between opposing inner spacers 127. The exposed semiconductor layers can be referred to as nanostructures (e.g., nanowires or nanosheets). In some embodiments, semiconductor layers 122 are removed (not illustrated in FIGS. 6A and 6B) and semiconductor layers 124 form nanostructures. In some embodiments, an interlayer dielectric (ILD) layer 618 is deposited between spacers 114 and polysilicon gate structures 112 are removed.

ILD layer 618 can be disposed on source/drain structure 502 of the source/drain regions and between spacers 114. ILD layer 618 can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, the flowable silicon oxide can be deposited using flowable CVD (FCVD). In some embodiments, the dielectric material is silicon oxide. Other materials and formation methods for ILD layer 618 are within the scope and spirit of this disclosure.

The formation of ILD layer 618 can be followed by removing polysilicon gate structures 112 and semiconductor layers 124 using a dry etching process (e.g., reaction ion etching) or a wet etching process, exposing portions of semiconductor layers 122. The exposed semiconductor layers 122 can be referred to as nanostructures (e.g., nanowires or nanosheets). Depending on the type of devices being formed, semiconductor layers 122 can be removed, exposing portions of semiconductor layers 124, which can also be referred to as nanostructures. In some embodiments, the gas etchants used in the dry plasma etching process can include hydrogen and radicals, such as chlorine, fluorine, bromine, or a combination thereof. For example, the gas etchants can include hydrogen bromide, hydrogen chloride, or any suitable gas etchants. In some embodiments, wet chemical etching can be used. Etchants for the wet chemical etching process can include ozone mixed with one or more of hydrogen fluoride, hydrogen chloride, hydrogen peroxide, or any suitable chemical etchants. In some embodiments, a dry etch followed by a wet etch process can be used.

After polysilicon gate structures 112 and semiconductor layers 124 are removed, portions of top surface 106A of substrate 106 are exposed between the bottom-most opposing inner spacers 127. Referring to FIG. 6B, an opening can be formed on these portions of top surface 106A. For example, openings 602 can be formed in substrate 106 and under the bottom-most opposing inner spacers 127. A cross-sectional view of a substantially oval-shaped opening 602 is illustrated in FIG. 6B and can be formed using isotropic etching processes. In some embodiments, the etching processes used to form openings 602 can be similar to those that are used to removed semiconductor layers 124. For example, a wet chemical etching process using hydrogen chloride can be used to form opening 602. In some embodiments, opening 602 can have any suitable shapes, such as a substantially triangular shape, a substantially rectangular shape, a substantially circular shape, or any suitable shapes. In some embodiments, dry plasma etching with less radio-frequency (RF) power supply can provide a more isotropic etch and extend openings 602 further under inner spacers 127.

The atomic concentrations of semiconductor layer 124 and substrate 106 can be adjusted to enable controlled etching to form a nominal shape for openings 602. In some embodiments, semiconductor layer 124 and substrate 106 can be formed using similar material with different atomic concentrations. The different atomic concentrations can lead to different etching rates of semiconductor layers 124 and substrate 106. A greater difference in atomic concentration can lead to a greater difference in the etching rates. For example, silicon germanium material having germanium atomic concentration of about 10% can be etched significantly faster (e.g., 10 times greater) than silicon material. Accordingly, increasing or decreasing the germanium concentration can increase or decrease the etching rate differences of silicon germanium materials.

In some embodiments, upper portions of substrate 106 can have similar atomic concentrations as semiconductor layers 124 whereas lower portions of substrate 106 can have a lower atomic concentration such that etching rate of substrate 106 reduces as the etching process proceeds deeper into substrate 106. The reduced etching rate deeper into substrate 106 can facilitate easier control of etching depth and shape of opening 602. For example, semiconductor layers 124 and a top portion 610 of substrate 106 can both be formed using a silicon germanium material with similar germanium atomic concentrations. Lower portion 620 of substrate 106 can be formed using silicon germanium with a germanium atomic concentration lower than that of upper portion 610 and semiconductor layers 124. For example, a germanium concentration of lower portion 620 can be less than a germanium concentration of upper portion 610 by about 5% to about 10%. In some embodiments, germanium atomic concentration in substrate 106 gradually decreases as measured from top surface 106A of substrate 106. In some embodiments, upper portion 610 can have a germanium atomic concentration greater than that of semiconductor layers 124 and lower portion 620 can have a germanium atomic concentration lower than that of semiconductor layers 124. In some embodiments, germanium atomic concentration at top surface 106A of substrate 106 can be similar to that of semiconductor layers 124. In some embodiments, boundary 630 between upper and lower portions 610 and 620 can represent a portion of substrate 106 that contains similar germanium concentration to that of semiconductor layer 124. In some embodiments, substrate 106 has a gradually decreasing atomic centration and boundary 630 can represent a portion of substrate 106 that has a sufficiently low carrier density due to low atomic concentration, which in turn prevents the formation of leakage current flow. For example, atomic concentration at boundary 630 can be between about 12% and about 18%. In some embodiments, atomic concentration at boundary 630 can be about 15% and portions of substrate 106 below boundary 630 have atomic concentrations less than about 15%. In some embodiments, openings 602 can extend vertically (e.g., z direction) to boundary 630, as illustrated in FIG. 6B. In some embodiments, openings 602 can extend over boundary 630 and deeper into substrate 106. In some embodiments, boundary 630 can be between about 0.2 nm and about 2.0 nm, between about 0.5 nm and about 1.7 nm, between about 0.8 nm and about 1.2 nm, or any suitable dimensions. Having openings 602 extend over boundary 630 can provide the benefits of lowering the probability of forming leakage current due to the reduced carrier density of substrate 106 below opening 602.

Figure 7:
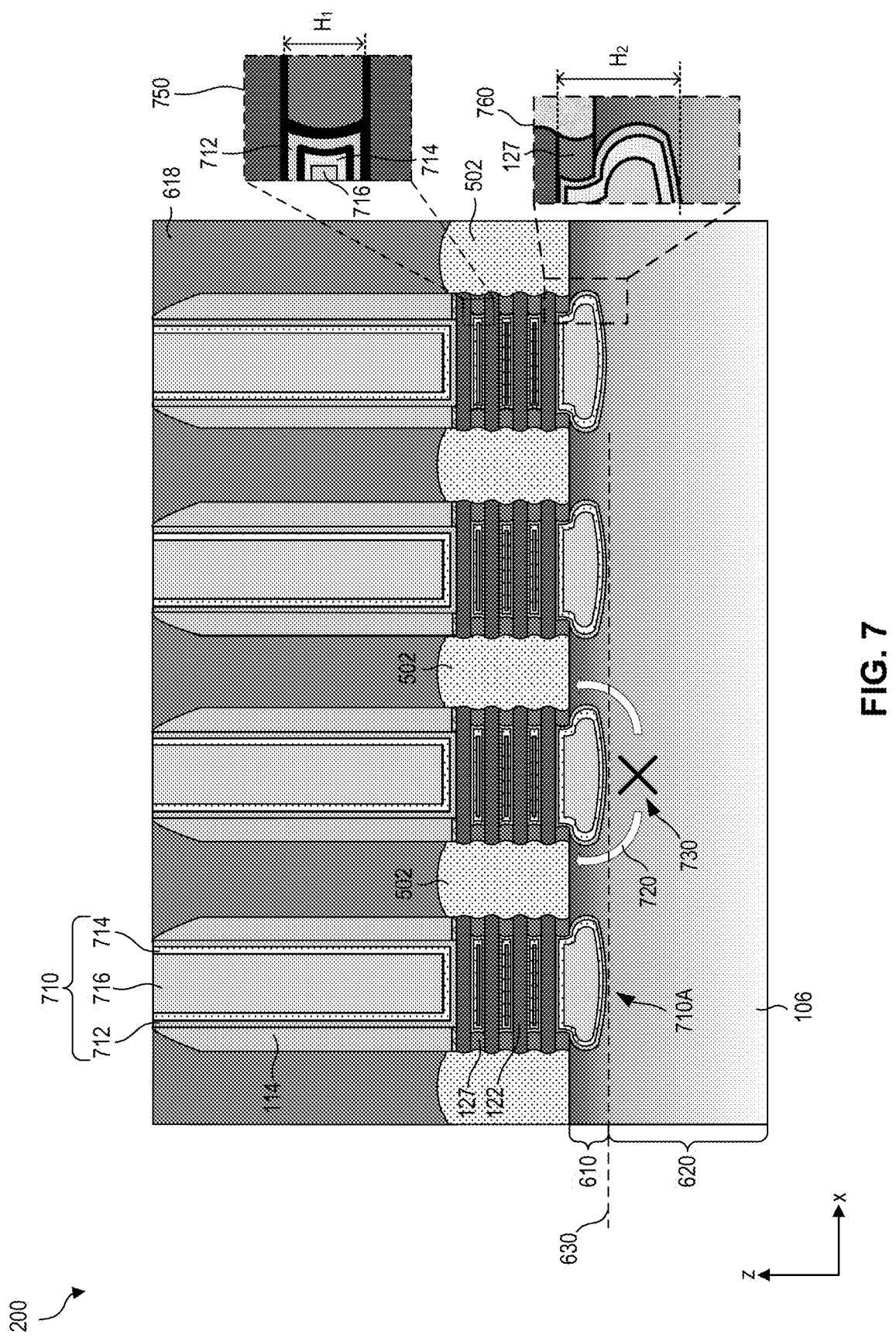

Referring to FIG. 1, in operation 130, gate dielectric layers, work function layers, and gate electrodes are deposited in the opening and on the nanostructures, according to some embodiments. Referring to FIG. 7, a gate stack 710 including gate dielectric layers 712, work function layers 714, and gate electrode 716 are formed in opening 602 and on semiconductor layers 122.

Gate dielectric layers 712 can be formed on the semiconductor layers. In some embodiments, gate dielectric layers 712 can be wrapped around on exposed nanostructure-shaped semiconductor layers 122. In some embodiments, semiconductor layers 122 can be nanosheets or nanowires. Forming gate dielectric layers 712 can include a blanket deposition process of a suitable gate dielectric material layer. In some embodiments, gate dielectric layers 712 can be formed of a high-k dielectric material (e.g., dielectric material having dielectric constant greater than about 3.9). For example, gate dielectric layers 712 can be formed of hafnium oxide. Work function layers 714 are formed on gate dielectric layers 712. In some embodiments, each work function layer 714 can include one or more work function metal layers and formed using the same or different material and/or thickness. Gate dielectric layers 712 and gate work function layers 714 can each wrap around nanostructure-shaped semiconductor layers 122. Depending on the spaces between adjacent semiconductor layers 122, semiconductor layers 122 can be wrapped around by gate dielectric layer 712 and work function layers 714, filling the spaces between adjacent semiconductor layers 122. In some embodiments, subsequently formed gate electrode material can also be formed in the spaces between adjacent semiconductor layers 122, as illustrated in enlarged view 750 and described below.

Gate electrodes 716 can be formed on the work function layers, according to some embodiments. Layers of conductive material for gate electrodes 716 are formed on work function layers 714. As shown in enlarged view 750, if separations between adjacent semiconductor layers 122 are sufficient to accommodate the thickness of the gate electrode material, gate electrodes 716 can be formed between adjacent semiconductor layers 122 and on work function layers 714 such that the spaces between adjacent semiconductor layers 122 are filled. Gate electrodes 716 that are between adjacent semiconductor layers 122 and gate electrodes 716 that are formed between spacers 114 are electrically coupled to each other. The layer of conductive material for gate electrodes 716 can include suitable conductive materials, such as titanium, silver, aluminum, tungsten, copper, ruthenium, molybdenum, tungsten nitride, cobalt, nickel, titanium carbide, titanium aluminum carbide, manganese, zirconium, metal alloys, and combinations thereof. Gate electrodes 716 can be formed by ALD, PVD, CVD, or any other suitable deposition process. The deposition of gate electrodes 716 can continue until openings between opposing spacers 114 are filled with gate electrodes 716. A chemical mechanical polishing process can remove excessive gate electrodes 716 such that top surfaces of gate electrodes 716 and ILD layer 618 are substantially coplanar. In some embodiments, other structures can be formed, such as blocking layers. One or more blocking layers (not shown in FIG. 7) can be formed prior to depositing gate electrodes 716 to prevent diffusion and oxidation of gate electrodes 716.

Extended gate stack 710A is referred to the portion of gate stack 710 that is formed under the bottom-most semiconductor layer 122 and in opening 602. Extended gate stack 710A can include a first portion formed between opposing inner sidewalls of inner spacers 127 and a second portion formed in opening 602. The first and second portions of extended gate stack 710A are formed directly under the bottom-most nanostructures, such as the bottom-most layer of semiconductor layers 122. The second portion of extended gate stack 710A is also extend to directly under the bottom-most inner spacers 127 and contours the shape of opening 602. Therefore, the second portion of extended gate stack 710A can be formed of a substantially oval shape, a substantially circular shape, a substantially rectangular shape, or any suitable shapes. Extended gate stack 710A can also have a substantially planar bottom surface in contact with substrate 106. As illustrated in FIG. 7, a leakage path 720 can form between a pair of source/drain structures 502 through the body of substrate 106. However, because extended gate stack 710A extend to or below boundary 630, lower portion 620 of substrate 106 may not provide sufficient carrier concentration to cause the flow of leakage current, such that a break such as circuit break 730 can be formed.

Enlarged view 760 illustrates a portion of extended gate stack 710A. As shown in enlarged view 760, gate stack 710A can extend horizontally (e.g., x direction) under inner spacer 127. In some embodiments, gate stack 710A is in contact with inner sidewall surfaces and a bottom surface of inner spacers 127. A height of inner spacers 127 can be referred to as height $H_1$. In some embodiments, height H1 can be between about 3 nm and about 10 nm, between about 5 nm and about 7 nm, or any suitable heights. In some embodiments, extended gate stack 710A can extend into substrate 106 by a height $H_2$ as measured from a bottom surface of the bottom-most semiconductor layer 122 and a bottom surface of extended gate stack 710A. In some embodiments, height H2 can be between about 5 nm and about 15 nm, between about 7 nm and about 13 nm, between about 9 nm and about 11 nm. A height ratio of height $H_2$ over height $H_1$ can be between about 1.01 and about 3. For example, the ratio can be between about 1.05 and about 2.2, between about 1.3 and about 1.8, between about 1.4 and about 1.6. In some embodiments, the ratio can be between about 1.01 and about 1.5. A greater height ratio can indicate a deeper extended gate stack 710A which in turn provides lower leakage current.

Figure 8:
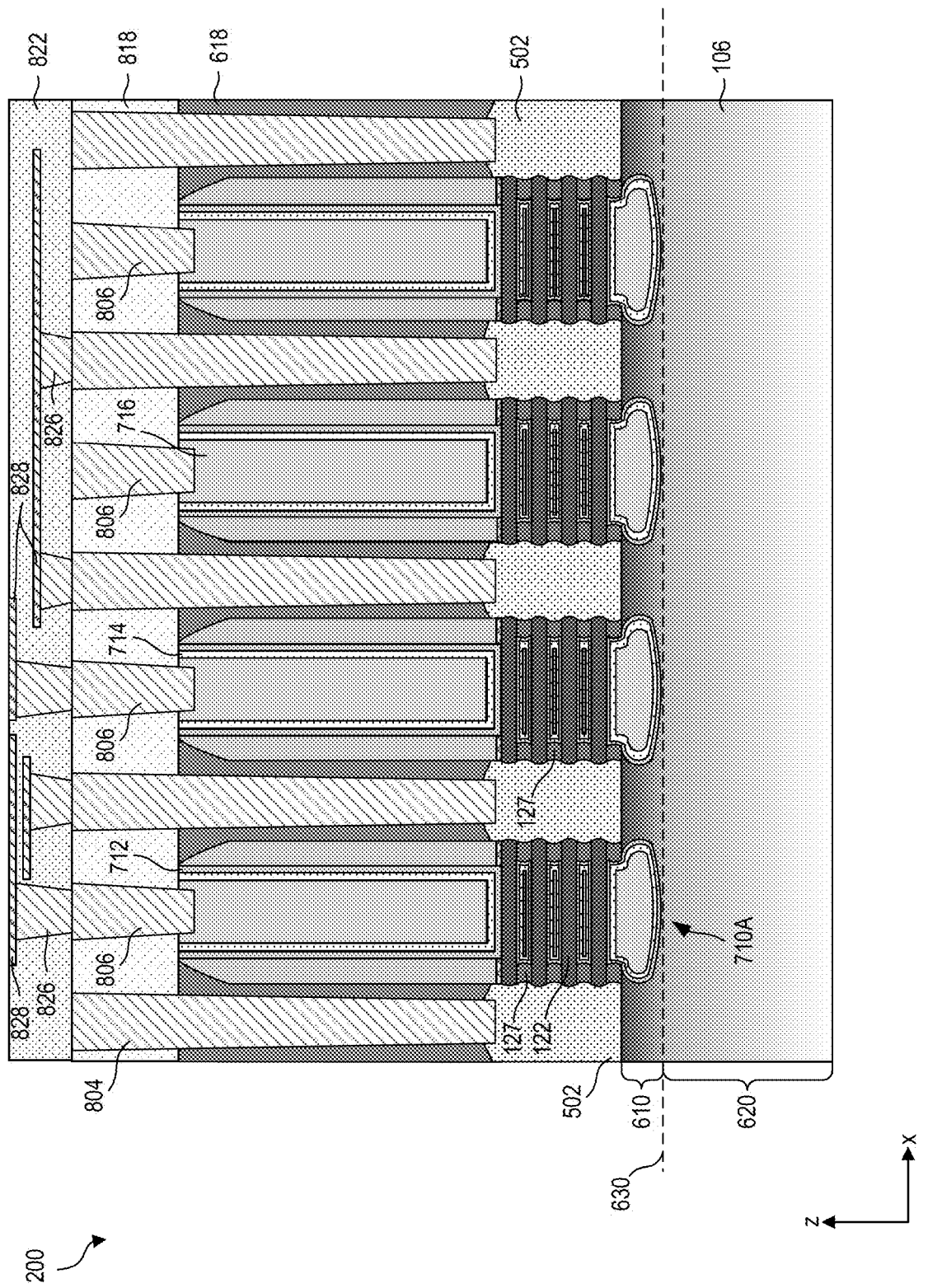

Referring to FIG. 1, in operation 135, source/drain contacts and gate contacts are formed, according to some embodiments. Referring to FIG. 8, source/drain contacts 804 and gate contacts 806 are formed to provide electrical connections to the source/drain regions and the gate electrodes, respectively. Specifically, source/drain contacts 804 and gate contacts 806 can be used to transmit electrical signals between source/drain regions and gate electrodes and external terminals (not shown in FIG. 8). For example, gate contacts 806 can be electrically coupled to gate electrodes 716 formed between spacers 114 and between adjacent semiconductor layers 122. Additional ILD layers can be formed on the top surface of ILD layer 618. For example, dielectric layer 818 can be formed on ILD layer 618. In some embodiments, dielectric layer 818 can be formed using similar material as ILD layer 618. Gate contacts 806 and source/drain contacts 804 can be formed by forming openings in dielectric layer 808, gate electrodes 716, and ILD layer 618, and depositing a conductive material in the openings. The deposition process can include depositing a metal layer within the openings and performing an anneal process to induce silicidation of the deposited metal layer. The conductive materials for forming source/drain contacts 804 and gate contacts 806 can include titanium, aluminum, silver, tungsten, cobalt, copper, ruthenium, zirconium, nickel, titanium nitride, tungsten nitride, metal alloys, and/or combinations thereof. The deposition process can include ALD, PVD, CVD, any suitable deposition processes, and/or combinations thereof. Gate contacts 806 and source/drain contacts 804 can be connected to gate electrodes 716 and third epitaxial layer 902 of the source/drain region, respectively.

A planarization process can planarize the top surfaces of dielectric layer 808, source/drain contacts 804, and gate contacts 806 such that the top surfaces are substantially coplanar. In some embodiments, gate contacts 806 can extend into gate electrodes 716. Silicide regions (not shown in FIG. 8) can be formed between source/drain contacts 804 and source/drain structures 502 to reduce contact resistance. In some embodiments, the silicide regions can include ruthenium silicide, nickel silicide, cobalt silicide, tungsten silicide, tantalum silicide, platinum silicide, erbium silicide, palladium silicide, any suitable silicide material, and/or combinations thereof.

Back-end-of-line (BEOL) interconnect structures are formed over source/drain contacts 804 and gate contacts 806. BEOL interconnect structures can be formed in dielectric layers 822 deposited on dielectric layer 808. Interconnects can be formed in dielectric layer 822. In some embodiments, the interconnects can be a network of electrical connections that include vias 826 extending vertically (e.g., along the z-axis) and wires 828 extending laterally (e.g., along the x-axis). Interconnect structures can provide electrical connections to source/drain contacts 804 and gate contacts 806. In some embodiments, suitable passive and active semiconductor devices can be formed in dielectric layers 808 and 822 and are not illustrated for simplicity.

FIGS. 9-13 illustrate various semiconductor structures incorporating an extended gate stack to reduce leakage current. Reference numerals in FIGS. 9-13 that are similar to those in FIGS. 2A-8 generally indicate identical, functionally similar, and/or structurally similar elements.

Figure 9:
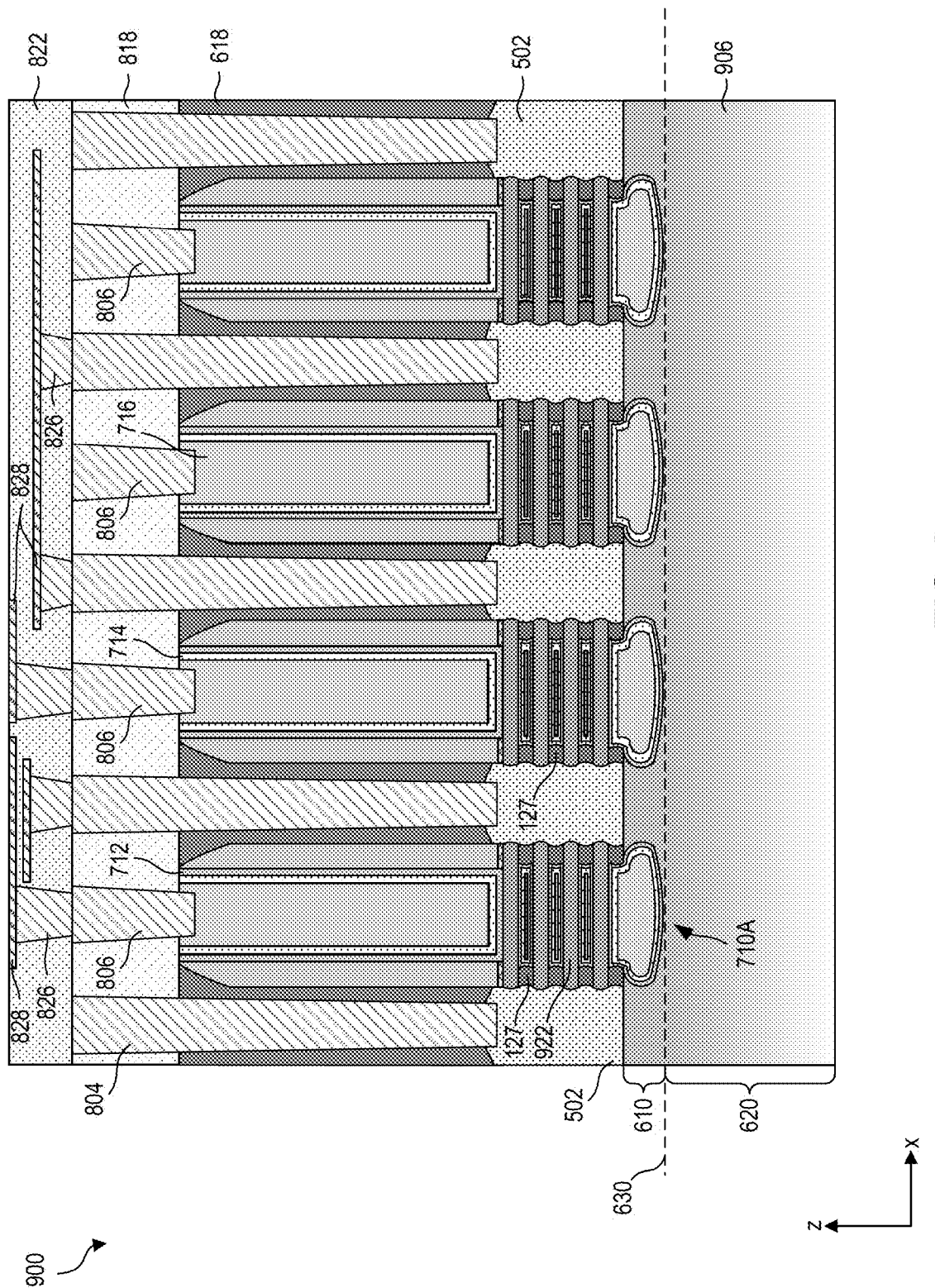
FIGS. 9-13 illustrate various semiconductor devices incorporating extended gate structures, in accordance with some embodiments.

FIG. 9 illustrates a semiconductor structure 900 incorporating an extended gate stack, according to some embodiments. Semiconductor structure 900 includes a substrate 906 formed using silicon and semiconductor layers 922 formed using silicon germanium. Semiconductor layers 922 can be nanostructures, such as nanosheets or nanowires. Semiconductor layers 922 can be formed by depositing a stack of semiconductor layers including alternating layers of silicon and silicon germanium, removing the silicon material, and exposing the silicon germanium material. In some embodiments, the silicon material can be removed using a wet chemical etching process using chemical etchants, such as a mixture of ammonium hydroxide and hydrogen peroxide, a hydrofluoric or alkaline-based wet chemical etchant, and any suitable wet chemical etchants.

Figure 10:
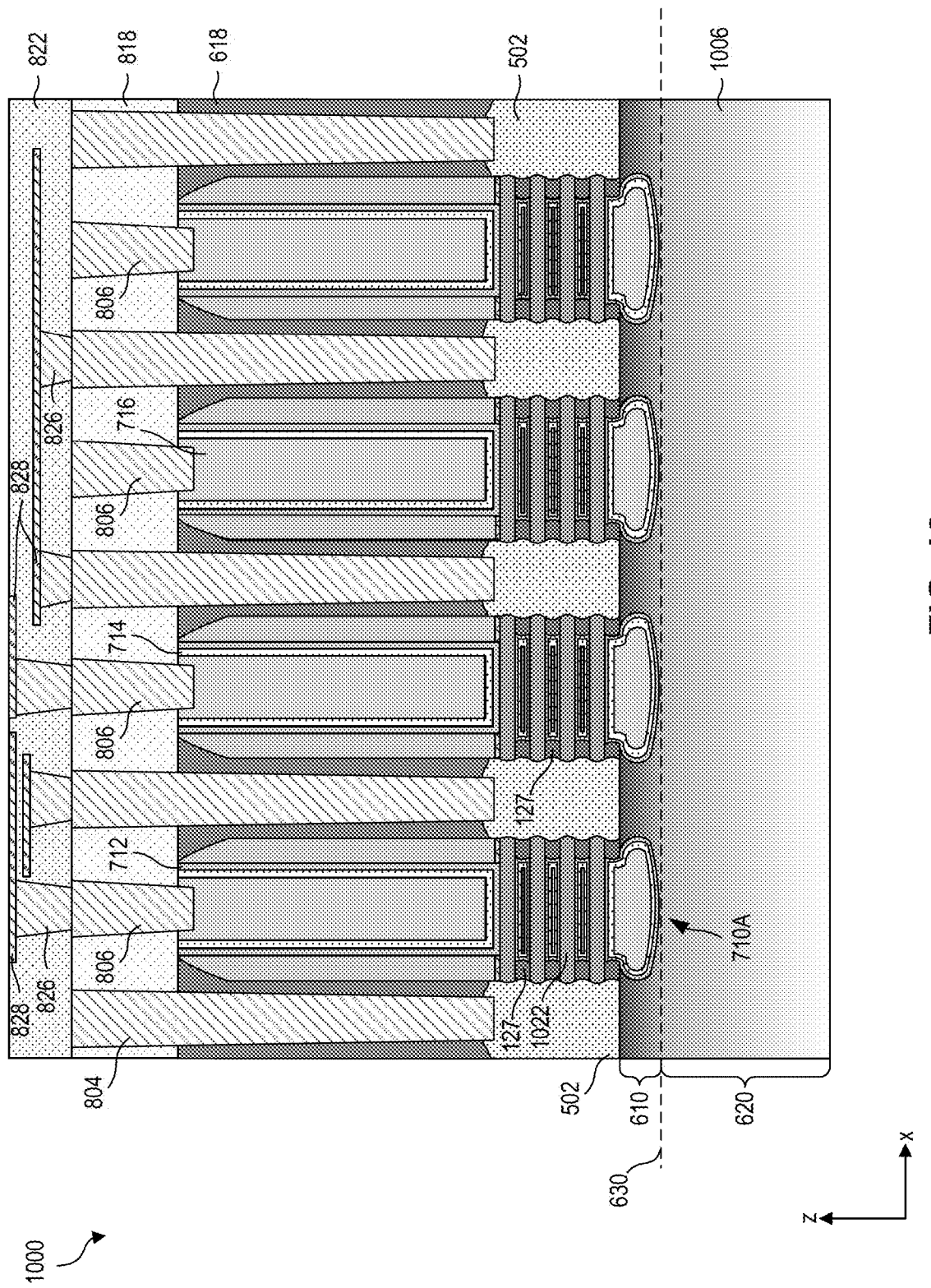

FIG. 10 illustrates a semiconductor structure 1000 incorporating an extended gate stack, according to some embodiments. Semiconductor structure 1000 includes a substrate 1006 and semiconductor layers 1022 formed using silicon germanium. Semiconductor layers 1022 can be nanostructures, such as nanosheets or nanowires. Semiconductor layers 1022 can be formed by depositing a stack of semiconductor layers including alternating layers of silicon and silicon germanium, removing the silicon material, and exposing the silicon germanium material. Etching processes to remove the silicon material can be similar to those described with respect to in FIG. 9.

Figure 11:
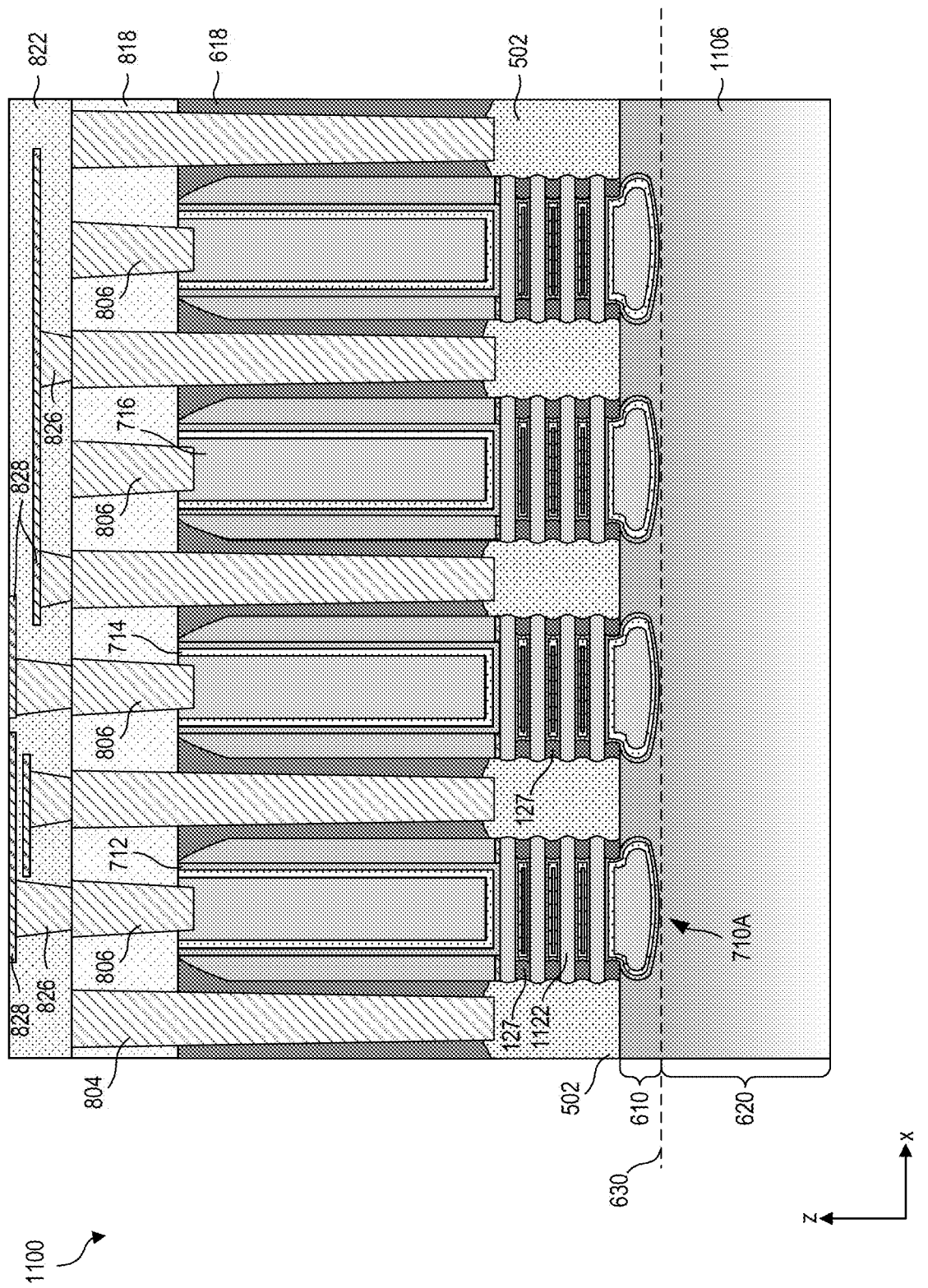

FIG. 11 illustrates a semiconductor structure 1100 incorporating an extended gate stack, according to some embodiments. Semiconductor structure 1100 includes a substrate 1106 and semiconductor layers 1122 formed using silicon. Semiconductor layers 1122 can be nanostructures, such as nanosheets or nanowires. Semiconductor layers 1122 can be formed by depositing a stack of semiconductor layers including alternating layers of silicon and silicon germanium, removing the silicon germanium material, and exposing the silicon material. Etching processes to remove the silicon germanium material can be a wet chemical etching process using suitable chemical etchants, such sulfuric acid, a mixture of hydrofluoric acid and ozone, or any suitable wet chemical etchants.

Figure 12:
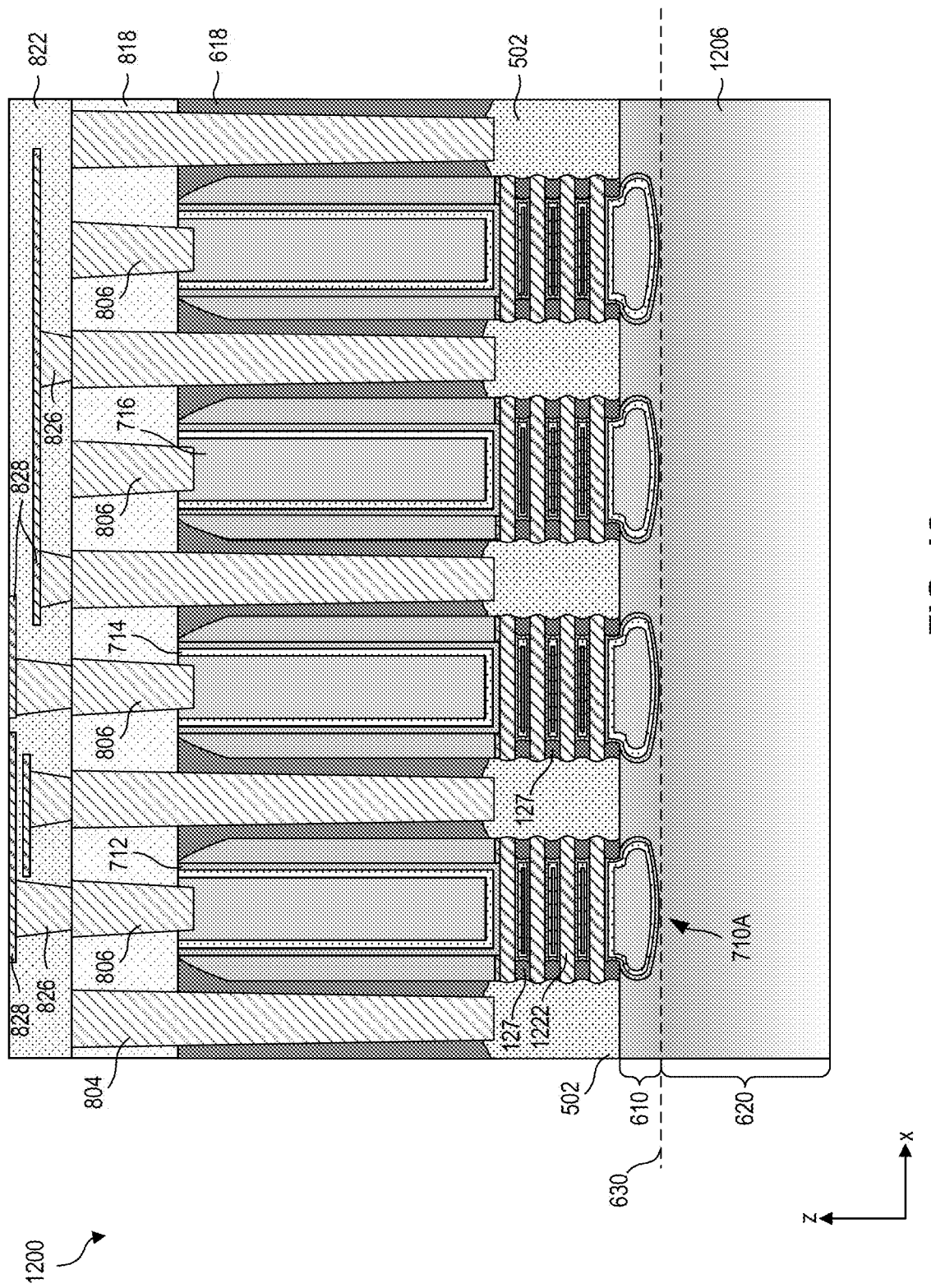

FIG. 12 illustrates a semiconductor structure 1200 incorporating an extended gate stack, according to some embodiments. Semiconductor structure 1200 in includes a substrate 1206 and semiconductor layers 1222 formed using germanium. Semiconductor layers 1222 can be nanostructures, such as nanosheets or nanowires. Semiconductor layers 1222 can be formed by depositing a stack of semiconductor layers including alternating layers of germanium and a germanium tin alloy, removing the germanium tin alloy, and exposing the germanium material. Etching processes to remove the germanium tin alloy can be a wet chemical etching process or a dry etching process.

Figure 13:
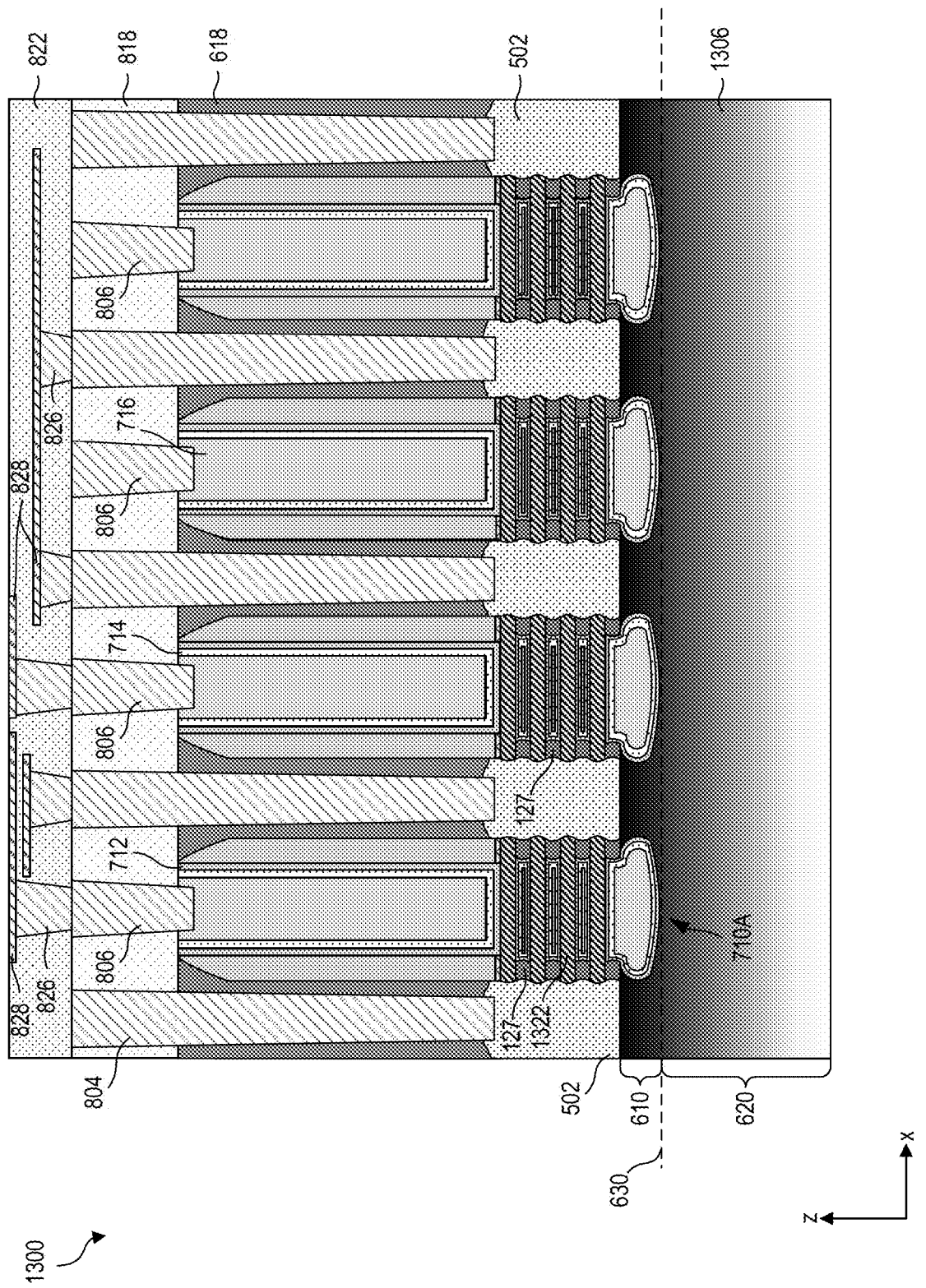

FIG. 13 illustrates a semiconductor structure 1300 incorporating an extended gate stack, according to some embodiments. Semiconductor structure 1300 includes a substrate 1306 and semiconductor layers 1322 formed using silicon germanium. Semiconductor layers 1322 can be nanostructures, such as nanosheets or nanowires. Semiconductor layers 1322 can be formed by depositing a stack of semiconductor layers including alternating layers of silicon germanium and a germanium tin alloy, removing the germanium tin alloy, and exposing the silicon germanium material. Etching processes to remove the germanium tin alloy can be a wet chemical etching process or a dry etching process.

Various embodiments in the present disclosure describe methods for forming a gate stack extending into a region of a substrate that has lower carrier mobility, which in turn reduces current leakage between a pair of source/drain regions. The extended gate stack can be formed by etching an opening that extends from an upper region of the substrate to a lower region of the substrate that has a lower carrier concentration. The opening can also extend under inner spacers located on side surfaces of the gate stack. The gate stack, including gate dielectric layers and gate electrodes, can be formed in the opening. The extended gate stacks described herein provide various benefits such as improved device performance and reliability.

In some embodiments, a semiconductor device includes nanostructures on a substrate and a source/drain region in contact with the nanostructures. The semiconductor device also includes a gate structure that includes first and second portions. The first portion is formed between each nanostructure of nanostructures. The second portion is formed under the bottom-most nanostructure of the plurality of nanostructures and extends under a top surface of the substrate.

In some embodiments, a semiconductor device includes nanostructures over a substrate and inner spacers. Each inner spacer is formed under a nanostructure of the nanostructures. The semiconductor device also includes a gate structure including first and second portions. The first portion is wrapped around each nanostructure of the nanostructures. The second portion is formed under a bottom-most nanostructure of the nanostructures and extends under a top surface of the substrate.

In some embodiments, a method includes depositing first and second groups of semiconductor layers to form a stack of alternating semiconductor layers on a substrate. The method also includes forming spacers on sidewalls of the first group of semiconductor layers. The method further includes removing the first group of semiconductor layers such that a portion of a top surface of the substrate and portions of the second group of semiconductor layers are exposed between the plurality of spacers. The method also includes forming an opening by etching the portion of the top surface of the substrate that is exposed between the spacers such that the opening extends below the top surface of the substrate. The method further includes forming a gate structure that includes first and second portions. The first portion of the gate structure is wrapped around each semiconductor layer of the second group of semiconductor layers. The second portion of the gate structure is formed in the opening.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a plurality of nanostructures on a substrate;
a source/drain region in contact with the plurality of nanostructures; and
a gate structure, comprising:
a first portion formed between each nanostructure of the plurality of nanostructures;
a plurality of inner spacers, wherein an inner spacer of the plurality of inner spacers is disposed between adjacent nanostructures of the plurality of nanostructures; and
a second portion formed under a bottom-most nanostructure of the plurality of nanostructures and extending under a top surface of the substrate, wherein the second portion extends laterally under a bottom-most inner spacer of the plurality of inner spacers and is in contact with a bottom surface of the bottom-most inner spacer.

2. The semiconductor device of claim 1, wherein the second portion of the gate structure is in contact with an inner surface of the bottom-most inner spacer of the plurality of inner spacers.

3. The semiconductor device of claim 1, wherein a ratio of a height of the second portion of the gate structure over a height of an inner spacer of the plurality of inner spacers is between about 1.01 and about 1.5.

4. The semiconductor device of claim 1, wherein a cross-sectional area of the second portion of the gate structure comprises an oval shape.

5. The semiconductor device of claim 1, wherein the substrate comprises a non-uniform atomic concentration of germanium that decreases from the top surface of the substrate to a bottom surface of the substrate.

6. The semiconductor device of claim 1, wherein the substrate comprises silicon and the plurality of nanostructures comprises silicon germanium.

7. The semiconductor device of claim 1, wherein the second portion of the gate structure is oval shaped.

8. The semiconductor device of claim 1, wherein the second portion of the gate structure is in contact with a sidewall surface of the bottom-most inner spacer of the plurality of inner spacers.

9. The semiconductor device of claim 1, wherein a substantially planar bottom surface of the second portion of the gate structure is in contact with the substrate.

10. A semiconductor device, comprising:
a plurality of nanostructures over a substrate;
a plurality of inner spacers, wherein each inner spacer is formed under a nanostructure of the plurality of nanostructures; and a gate structure, comprising:
- a first portion wrapped around each nanostructure of the plurality of nanostructures; and
- a second portion formed under a bottom-most nanostructure of the plurality of nanostructures, wherein the second portion extends under a top surface of the substrate, and wherein the second portion extends laterally under a bottom-most inner spacer of the plurality of inner spacers.

11. The semiconductor device of claim 10, wherein the second portion of the gate structure is in contact with a sidewall surface and a bottom surface of the bottom-most nanostructure of the plurality of nanostructures.

12. The semiconductor device of claim 10, wherein a ratio of a height of the second portion of the gate structure over a height of an inner spacer of the plurality of spacers is between about 1.01 and about 1.5.

13. The semiconductor device of claim 10, wherein the substrate comprises a non-uniform atomic concentration of germanium that decreases from the top surface of the substrate to a bottom surface of the substrate.

14. The semiconductor device of claim 10, wherein the second portion of the gate structure is oval shaped.

15. A semiconductor device comprising:
- a stack of alternating layers on a substrate comprising a first group of semiconductor layers and a second group of gate layers;
- a plurality of spacers on sidewalls of each gate layer of the second group of gate layers;
- a gate structure, comprising:
  - a first portion comprising the second group of gate layers wrapped around each semiconductor layer of the first group of semiconductor layers; and
  - a second portion under a top surface of the substrate and extending laterally under a bottom-most spacer of the plurality of spacers.

16. The semiconductor device of claim 15, wherein the substrate comprises silicon.

17. The semiconductor device of claim 15, wherein the second portion of the gate structure is in contact with a bottom surface of the bottom-most spacer of the plurality of spacers.

18. The semiconductor device of claim 15, wherein the first group of semiconductor layers comprises silicon germanium layers.

19. The semiconductor device of claim 15, wherein a cross-sectional profile of the second portion of the gate structure is an oval shape.

20. The semiconductor device of claim 15, wherein the second portion of the gate structure comprises the second group of gate layers.

* * * * *